(12) United States Patent
Barr et al.

(10) Patent No.: US 9,184,872 B2
(45) Date of Patent: Nov. 10, 2015

(54) METHOD AND APPARATUS FOR LDPC TRANSMISSION OVER A CHANNEL BONDED LINK

(71) Applicant: Entropic Communications, LLC, Carlsbad, CA (US)

(72) Inventors: David Barr, San Jose, CA (US); Michail Tsatsanis, Huntington Beach, CA (US); Arndt Mueller, San Diego, CA (US); Na Chen, San Diego, CA (US)

(73) Assignee: ENTROPIC COMMUNICATIONS, LLC, Carlsbad, CA (US)

( * ) Notice: Subject to any disclaimer, the term of this patent is extended or adjusted under 35 U.S.C. 154(b) by 0 days.

(21) Appl. No.: 14/510,971

(22) Filed: Oct. 9, 2014

(65) Prior Publication Data
US 2015/0026544 A1    Jan. 22, 2015

Related U.S. Application Data

(60) Division of application No. 14/165,005, filed on Jan. 27, 2014, now Pat. No. 8,913,635, which is a continuation of application No. 13/402,014, filed on Feb. 22, 2012, now Pat. No. 8,638,808, which is a continuation-in-part of application No. 12/833,827, filed on Jul. 9, 2010, now Pat. No. 8,553,727.

(60) Provisional application No. 61/224,445, filed on Jul. 9, 2009.

(51) Int. Cl.
| | |
|---|---|
| *H04L 25/14* | (2006.01) |
| *H04L 1/00* | (2006.01) |
| *H04L 12/28* | (2006.01) |
| *H04L 12/911* | (2013.01) |
| *H04L 1/02* | (2006.01) |
| *H04L 5/00* | (2006.01) |
| *H04L 27/26* | (2006.01) |

(52) U.S. Cl.
CPC ............ *H04L 1/0042* (2013.01); *H04L 1/0009* (2013.01); *H04L 1/02* (2013.01); *H04L 5/0091* (2013.01); *H04L 12/2801* (2013.01); *H04L 12/2865* (2013.01); *H04L 25/14* (2013.01); *H04L 47/828* (2013.01); *H04L 27/2602* (2013.01)

(58) Field of Classification Search
None
See application file for complete search history.

(56) References Cited

U.S. PATENT DOCUMENTS

| | | |
|---|---|---|
| 8,059,546 B2 | 11/2011 | Pai et al. |
| 8,254,413 B2 | 8/2012 | Kliger et al. |
| 8,351,368 B2 | 1/2013 | Malik et al. |
| 2007/0143654 A1* | 6/2007 | Joyce et al. .................. 714/752 |

(Continued)

OTHER PUBLICATIONS

O'Shea, Dan. "MoCA 2.0 Set to Jolt Home Network." MoCA 2.0 Set to Jolt Home Network. Connected Planet Online, Jun. 15, 2010. Web. May 5, 2013. <http://connectedplanetonline.com/residential_services/news/moca-update-home-network-061510/>.

*Primary Examiner* — Ian N Moore
*Assistant Examiner* — Lakeram Jangbahadur
(74) *Attorney, Agent, or Firm* — McAndrews, Held & Malloy, Ltd.

(57) ABSTRACT

A particular overall architecture for transmission over a bonded channel system consisting of two interconnected MoCA (Multimedia over Coax Alliance) 2.0 SoCs (Systems on a Chip) and a method and apparatus for the case of a "bonded" channel network. With a bonded channel network, the data is divided into two segments, the first of which is transported over a primary channel and the second of which is transported over a secondary channel.

1 Claim, 3 Drawing Sheets

(56) References Cited

U.S. PATENT DOCUMENTS

Figure 1:
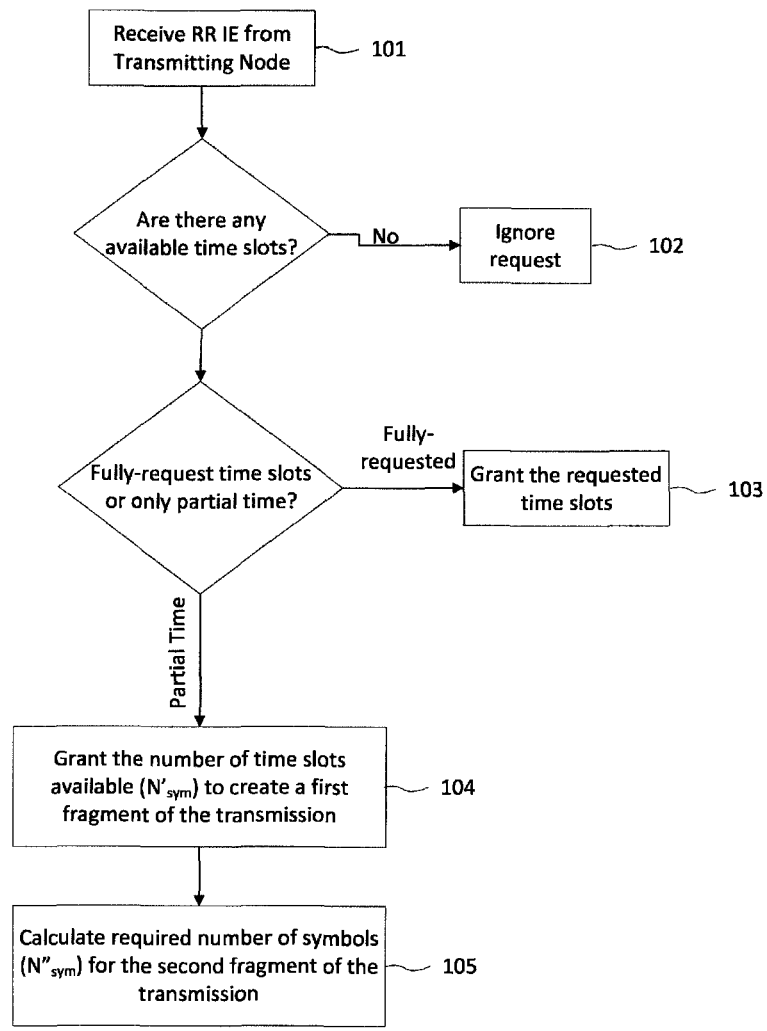
Figure 2:
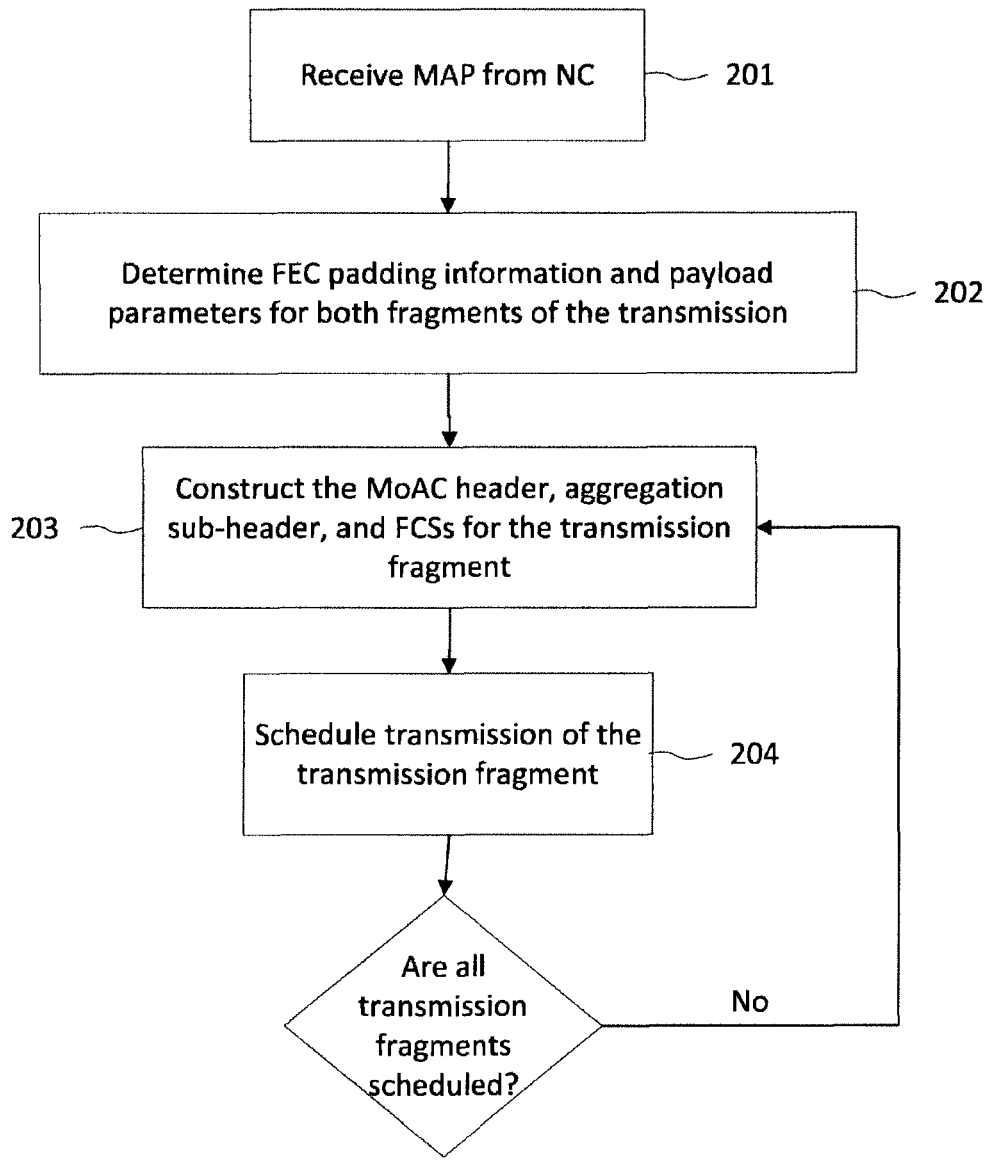
Figure 3:
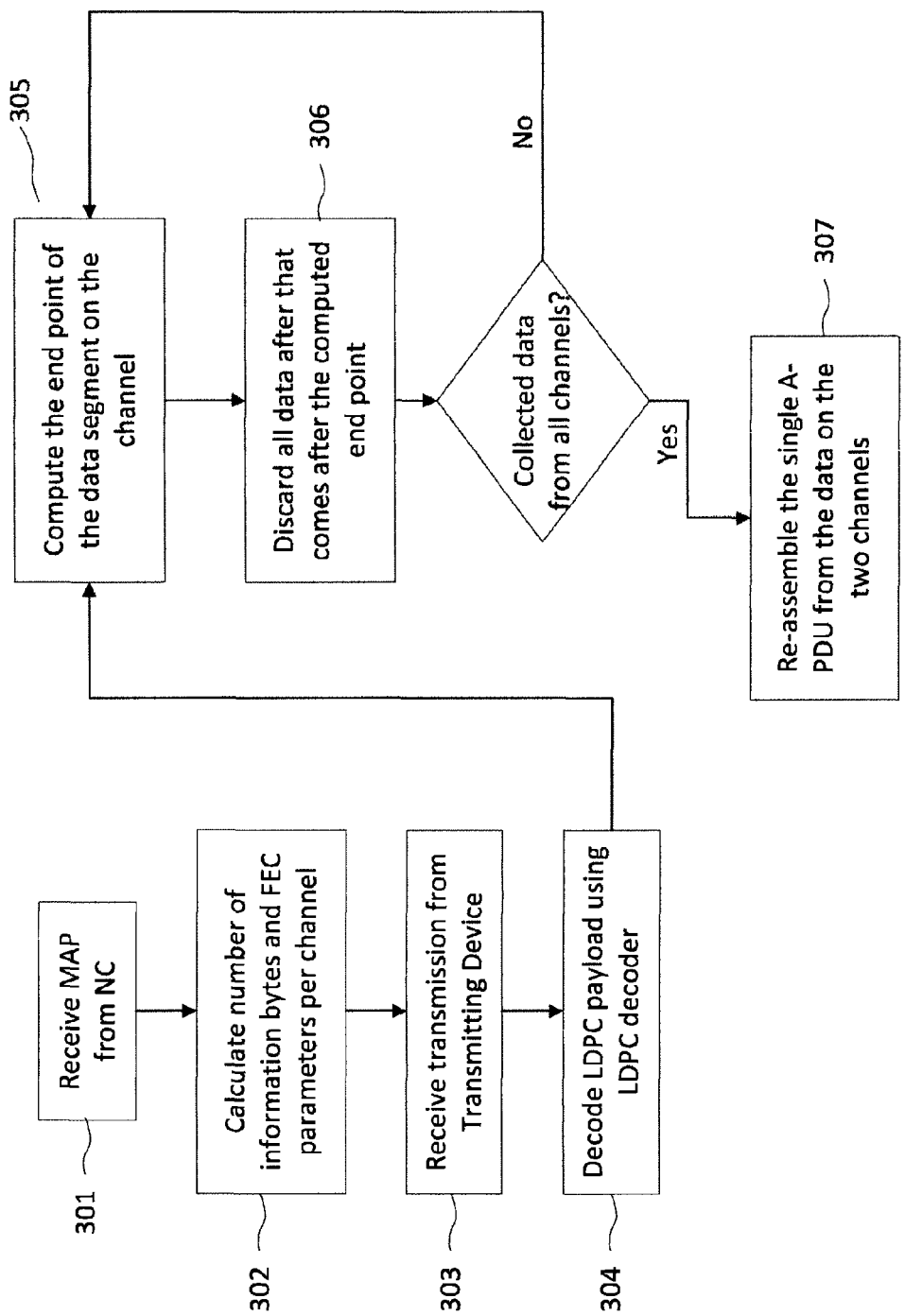

| | | | |
|---|---|---|---|
| 2009/0092154 A1* | 4/2009 | Malik et al. .................. 370/480 |
| 2010/0022186 A1 | 1/2010 | Wally |
| 2010/0061235 A1 | 3/2010 | Pai et al. |
| 2010/0238932 A1* | 9/2010 | Kliger et al. .................. 370/392 |

* cited by examiner

US 9,184,872 B2

METHOD AND APPARATUS FOR LDPC TRANSMISSION OVER A CHANNEL BONDED LINK

CROSS-REFERENCE TO RELATED APPLICATIONS

This application is a continuation of copending U.S. application Ser. No. 14/165,005, filed Jan. 27, 2014, which is a continuation of U.S. application Ser. No. 13/402,014, filed Feb. 22, 2012, now U.S. Pat. No. 8,638,808, which is a continuation in part of U.S. application Ser. No. 12/833,827, filed Jul. 9, 2010, now U.S. Pat. No. 8,553,727, which claims the priority benefit of U.S. Provisional Application No. 61/224,445, filed Jul. 9, 2009. Each patent application identified above is incorporated here by reference in its entirety to provide continuity of disclosure.

TECHNICAL FIELD

The disclosed method and apparatus relates to communications generally, and more particularly, some embodiments relate to communications over a bonded channel between nodes within a network.

BACKGROUND

In many communications applications, it is desirable to send as much information as possible as fast as possible. One way to increase the amount of information that can be sent in a predetermined amount of time is to send the information in parallel (i.e., send information over more than one wire or channel at the same time). However, in some communications systems, such parallel communications require coordination between the channels that are concurrently sending information.

In particular, in a home entertainment network, such as a network that is operated in accordance with the well-known MoCA standard, sending information over different channels requires coordination that makes it difficult to use hardware that is not in close communication.

In a single channel MoCA network, the process of transmitting an aggregate data packet (A-PDU) over the network consists of these steps:

A transmitting node requests a time slot for the transmission;
A Network Controller (NC) grants the request if channel resources are available;
The transmitting and receiving nodes transmit and receive packets at the specified times.

For this process to be successful, both the transmitter and the receiver independently calculate the appropriate LDPC forward error correction code parameters and the number of padding bits to be used.

When trying to coordinate more than one channel acting in concert to transmit information in parallel, coordinating such hardware can be cumbersome and complex. Accordingly, there is a need for a method and apparatus that will allow for relatively easy coordination of hardware that can transmit information over more than one "bonded" channel at the same time.

SUMMARY OF DISCLOSED METHOD AND APPARATUS

Various embodiments of the disclosed method and apparatus for low density parity check (LDPC) transmission over a bonded channel are presented.

According to one embodiment, a particular overall architecture is disclosed for transmission over a bonded channel system consisting of two interconnected MoCA (Multimedia over Coax Alliance) 2.0 SoCs ("Systems on a Chip).

This disclosure provides a method and apparatus for the case of a "bonded" channel network. With a bonded channel network, the data is divided into two segments, the first of which is transported over a primary channel and the second of which is transported over a secondary channel.

DETAILED DESCRIPTION

Derivation of the Reservation Request Parameters

In accordance with the well-known MoCA 2.0 standard for home entertainment communication networks, information is organized into protocol data units. Several of these protocol data units can be aggregated together to form an aggregated protocol data unit (A-PDU). For each A-PDU that a transmitting node has to transmit, a reservation request (RR) information element (IE) is sent to the network controller (NC) requesting a transmission slot for that A-PDU. An IE is defined as optional information that is encoded in a format. The format comprises a "Type", a "Length" and a "Value". The Type is a numeric code which indicates the kind of field that this part of the message represents. The Length is the size of the value field. The Value is a variable sized set of bytes which contains data for this part of the message. IEs are used in messages such as MAPs, Reservation Requests, Probe Reports, Pre-admission Discovery Requests and Responses, and Device Discovery messages, each of which are defined by the MoCA 2.0 specification.

In one embodiment of the disclosed method and apparatus, when a transmitting node has an A-PDU to transmit, the A-PDU comprising a particular number of bytes ("M"), the transmitting node calculates the number of symbols ($N_{sym}$) required to transmit the M bytes of the A-PDU. If both the transmitting and receiving node are capable of operating with channel bonding and the transmission indicates either a unicast profile in channel bonding or a VLPER (very low packet error rate) unicast profile in channel bonding by transmitting a physical layer (PHY) profile value that is equal to 0x12 (i.e., the hexadecimal value equivalent to the binary value "0001 0010"), the number of symbols $N_{sym}$ is calculated as follows:

$N_{BAS,1}$, $N_{BAS,2}$: The number of bits per Orthogonal Frequency Division Multiplexing (OFDM) symbol for the two channels to be used (i.e., the primary and extension channels), respectively;

$N_{parity}$: The number of parity bits per LDPC codeword (same for both channels);

$kLDPC_{max,1}$, $kLDPC_{max,2}$: Maximum LDPC codeword payload sizes from EVM reports for each channel $M_{OH}$: Bonded channel frame splitting overhead (fixed at 34 Bytes top to cover the worst case)

$M_{BAS,i}$: the (approximate) maximum number of payload bits per OFDM symbol for each channel i.

$M_{BAS} = M_{BAS,1} + M_{BAS,2}$: the maximum payload bits per bonded OFDM symbol Where:

$$M_{BAS,i} = \left\lfloor N_{BAS,i} \times \frac{kLDPC_{max,i}}{kLDPC_{max,i} + N_{parity}} \right\rfloor,$$

$i = 1, 2$

The ratio $p_i$ of the payload that can be carried by the primary channel with respect to the extension channel is calculated by the transmitting node with 16 bit precision as $$p_i = \text{floor}\left(2^{16} \times \frac{M_{BAS,i}}{M_{BAS}}\right) \times 2^{-16}$$

$$i = 1, 2$$

If $\lceil p_1(M+M_{OH})\rceil-18$ is a multiple of 4, then the number of bytes to be transmitted in the primary channel is calculated, by the transmitting node, as:

$$M_1 = \lceil p_1(M+M_{OH})\rceil$$

and as:

$$M_1 = \max(M, \lceil p_1(M+M_{OH})\rceil + 4 - ((\lceil p_1(M+M_{OH})\rceil - 18) \bmod 4))$$

in all other cases.

In this last manipulation, we extended the primary channel fragment (minus the MoCA header of 18 bytes) to the nearest 4 byte boundary in order to satisfy the requirement that each fragment is a multiple of 4 bytes. To prevent that extension from making $M_1$ exceed the total number of bytes M, the above equation caps $M_1$ to the total number of bytes M. Finally, the transmitting node calculates the payload of the secondary channel as:

$$M2 = M + M_{OH} - M_1$$

The minimum number of LDPC codewords needed to transport $M_i$ bytes is calculated as:

$$B_{min,i} = \left\lceil \frac{M_i \times 8}{kLDPC_{max,i}} \right\rceil$$

$$i = 1, 2$$

and the number of OFDM symbols needed to transmit those codewords is calculated as:

$$N_{SYM,i} = \left\lceil \frac{M_i \times 8 + B_{min,i} \times Nparity}{N_{BAS,i}} \right\rceil$$

$$i = 1, 2$$

Finally, the transmitting node calculates the number of OFDM symbols that need to be reserved as:

$$N_{SYM} = \max(N_{SYM,1}, N_{SYM,2})$$

Additionally, the transmitting node calculates a set of optimized forward error correction (FEC) parameters, and includes the number of the FEC padding bytes $M_{FECpad}$ in its RR. These parameters are calculated as follows:

The first step of this calculation includes computing the number of information bytes $Imax_i$, i=1,2 that can be transported in the primary and secondary channel in the given $N_{SYM}$. This is accomplished by application of the following equations:

The minimum number of LDPC codewords is calculated as:

$$B_{min,i} = \left\lfloor \frac{N_{sym} \times N_{BAS,i}}{kLDPC_{max,i} + Nparity} \right\rfloor$$

$$i = 1, 2$$

Targeted number of LDPC codewords is calculated as:

$$B_{LDPC,i} = B_{min,i} + \begin{cases} 0 & N_{sym} \times N_{BAS,i} - B_{min,i} \times (kLDPC_{max,i} + Nparity) < Nparity \\ 1 & \text{otherwise} \end{cases}$$

$$B_{LDPC,i} = \min(B_{LDPC,i}, N_{sym})$$

$$i = 1, 2$$

Target LDPC payload is calculated as:

$$kLDPC_{target,i} = \left\lceil \frac{N_{sym} \times N_{BAS,i}}{B_{LDPC,i}} \right\rceil - Nparity$$

$$i = 1, 2$$

Where:
($kLDPC_i$, $nLDPC_i$) code parameters for all but the last codeword $$kLDPC_i = \begin{cases} kLDPC_{max,i} & \text{if } kLDPC_{target,i} > kLDPC_{max,i} \\ N_{BAS,i} - Nparity & \text{if } kLDPC_{target,i} + Nparity < N_{BAS,i} \\ kLDPC_{target,i} & \text{otherwise} \end{cases}$$

$$nLDPC_i = kLDPC_i + Nparity$$

$$i = 1, 2$$

and where the number of information bytes is calculated as:

$$Imax_i = \begin{cases} \lfloor B_{LDPC,i} \times kLDPC_i / 8 \rfloor & \text{if } N_{sym} \times N_{BAS,i} - B_{LDPC,i} \times nLDPC_i \geq 0 \\ \lfloor (N_{sym} \times N_{BAS,i} - Nparity \times B_{LDPC,i})/8 \rfloor & \text{otherwise} \end{cases}$$

$$i = 1, 2$$

($kLDPC_{last,i}$, $nLDPC_{last,i}$) code parameters (for i=1,2) are calculated as follows:

$$kLDPC_{last,i} = 8 \times Imax_i - (B_{LDPC,i} - 1) \times kLDPC_i,$$

except if $kLDPC_{last,i} \leq 0$, in which case $B_{LDPC,i}$ and $kLDPC_{last,i}$ are modified from the above values as follows:

$$B_{LDPC,i} = B_{LDPC,i} - 1$$

$$kLDPC_{last,i} = kLDPC_{last,i} + kLDPC_i$$

where $B_{LDPC,i}$ is now the actual number of codewords.
$nLDPC_{last,i}$ is calculated as:
$nLDPC_{last,i} = kLDPC_{last,i} + Nparity$.

In addition to the number of information bytes, $Imax_i$, the above equations also compute the FEC parameters ($kLDPC_i$, $nLDPC_i$) and ($kLDPC_{last,i}$, $nLDPC_{last,i}$)

The required padding is calculated by the transmitting node as:

$$M_{FECpad,i} = Imax_i - M_i$$

$$N_{OFDMpad,i} = \lceil (N_{sym} \times N_{BAS,1} - (B_{LDPC,i}-1) \times nLDPC_i - nLDPC_{last,i})/8 \rceil_{i=1,2}$$

Notice that in the rare event that one of the two channels is granted one more OFDM symbol than what is strictly necessary to carry $M_i$ bytes, the number of FEC padding bytes may exceed the length of a codeword.

The transmitting node includes the summation of the two FEC padding bytes values $M_{FECpad,1}+M_{FECpad,2}$ in the field PARAMETERS of its RR IE. The transmitting node includes the required time slots for transmitting the A-PDU, computed from $N_{sym}$.

Scheduling of the AU by the NC

Once the RR IE is received by the NC, the requested AU (Allocation unit) has to be scheduled. The scheduling algorithm is understood by those of ordinary skill in the art and provided in the MoCA 2.0 standard. If the AU is successfully scheduled, then the NC will grant the time slots requested in the media access plan (MAP). If there is no time available for granting the AU then the NC will ignore the request. If there is only partial time available, the NC grants a number of OFDM symbols $N'_{sym}<N_{sym}$. In this case, the transmission will be fragmented. The NC calculates the number of symbols $N''_{sym}$ that will be required for the second fragment. This calculation is as follows:

The NC follows the calculations used to derive the Reservation Request Parameters (as noted above) for the requested number of symbols $N_{sym}$ and derive the quantities, $Imax_1$ and $Imax_2$.

Using these quantities together with the quantity $M_{FECpad,1}+M_{FECpad,2}$ from the RR IE, the NC calculates the total number of bytes by $$M=Imax_1+Imax_2-(M_{FECpad,1}+M_{FECpad,2}).$$

The NC follows the calculations used to derive the Reservation Request Parameters (as noted above) for the granted number of symbols $N'_{sym}<N_{sym}$ and derives the following quantities $Imax'_1$ and $Imax'_2$.

The NC further calculates the number of padding bytes in the primary and secondary channel of the first fragment to make the fragment a multiple of four bytes $M'_{FECpad,1}=Imax'_1 \mod 4$ and $M'_{FECpad,2}=Imax'_2 \mod 4$, respectively.

Given these quantities, the NC calculates the total number of bytes, M', transmitted in the first transmission of $N'_{sym}$ symbols as:

$$M'=Imax'_1+Imax'_2-M'_{FECpad,1}-M'_{FECpad,2}.$$

The NC also calculates the remaining bytes to be transmitted as: $M''=M-M'+M_{OH}$, adding the extra header overhead bytes for the second fragment.

Then, the NC follows the calculations used to derive the Reservation Request Parameters (as noted above) to derive the required number of symbols $N''_{sym}$ for the second fragment transmission given the number of bytes to be transmitted $M''+M_{OH}$ (including the overhead for splitting the second fragment across the two channels). Further fragmentation of the remaining aggregation unit (AU) of $N''_{sym}$ length is also possible, by repeating this process.

MAP Processing—Transmitting Node

Once the RR is transmitted, the transmitting node awaits reception of the MAP. After the MAP has been received, the transmitting node encodes and transmits the A-PDU in the granted AU using the following parameters:

FEC parameters ($kLDPC_1$, $nLDPC_1$) and ($kLDPC_{last,1}$, $nLDPC_{last,1}$) for the primary channel and ($kLDPC_2$, $nLDPC_2$) and ($kLDPC_{last,2}$, $nLDPC_{last,2}$) for the secondary channel;

Payload and padding parameters $M_1$, $M_{FECpad,1}$, $N_{OFDMpad,1}$ for the primary channel and $M_2$, $M_{FECpad,2}$, $N_{OFDMpad,2}$ for the secondary channel;

Bitloading PHY profile parameters, encryption key parameters etc.

If only a partial grant is received for a given A-PDU, the transmitting node follows the calculations used to calculate the scheduling of the AU by the NC (as noted above) for calculating the first granted fragment FEC padding information $M'_{FECpad,1}$ and payload $M'_1=Imax'_1-M'_{FECpad,1}$ for the primary channel and similarly $M'_{FECpad,2}$ and payload $M'_1=Imax'_2-M'_{FECpad,2}$ for the secondary channel. The MoCA header, aggregation sub-header and FCSs are constructed for the transmission in each channel, and the transmission of the first fragment is scheduled; then the process is repeated for the second (or more) granted fragments.

MAP Processing—Receiving Node

Upon reception of the MAP, the receiving node calculates the number of symbols in the granted AU from the information in the MAP IE. If the number of symbols is equal to the number of symbols requested $N_{sym}$ the receiving node follows the calculations used to derive the Reservation Request Parameters (as noted above) (given the number of symbols $N_{sym}$) and derives $Imax_1$, $Imax_2$.

In addition to the information bytes, $Imax_1$, this process also computes the FEC parameters ($kLDPC_i$, $nLDPC_i$) and ($kLDPC_{last,i}$, $nLDPC_{last,i}$) that will be needed when the transmission is scheduled.

Once the OFDM symbols are received and the LDPC decoder has decoded the LDPC payload, the receiving Node computes the end point of the data segment on each channel from the information received in the header of each channel segment. All data beyond this point is treated as FEC padding and will be discarded. The two segments across the two channels are re-assembled into a single A-PDU and processing from that point on will proceed as in the single channel case.

If the granted number of symbols is less than the requested $N'_{sym}<N_{sym}$, then the receiving node follows the calculations used to derive the Reservation Request Parameters (as noted above) (given the number of symbols $N'_{sym}$) and derives $Imax'_1$, $Imax'_2$.

In addition to the information bytes $Imax'_i$, this process also computes the FEC parameters (kLDPC'i, nLDPC'i) and (kLDPC'last,i, nLDPC'last,i) that will be needed when the fragment transmission is scheduled.

Once the OFDM symbols are received and the LDPC decoder has decoded the LDPC payload, the receiving Node SHALL compute the end point of the data segment on each channel from the information received in the header of each channel segment. All data beyond this point is treated as FEC padding and will be discarded. The two segments across the two channels are re-assembled into a single A-PDU fragment. The same process is repeated for the reception of the second fragment and the two fragments are further processed.

While various embodiments of the disclosed method and apparatus have been described above, it should be understood that they have been presented by way of example only, and should not limit the claimed invention. It will be apparent to one of skill in the art how alternative functional, logical or physical partitioning and configurations can be implemented to implement the desired features of the disclosed method and apparatus. Also, a multitude of different constituent module names other than those depicted herein can be applied to the various components and elements disclosed. Additionally, with regard to operational descriptions, the order in which the steps are presented herein shall not mandate that various embodiments be implemented to perform the recited functionality in the same order unless the context dictates otherwise.

Although the disclosed method and apparatus is described above in terms of various embodiments and implementations, it should be understood that the various features, aspects and functionality described in one or more of the individual embodiments are not limited in their applicability to the particular embodiment with which they are described. Thus, the breadth and scope of the claimed invention should not be limited by any of the above-described embodiments.

Terms and phrases used in this document, and variations thereof, unless otherwise expressly stated, should be construed as open ended as opposed to limiting. As examples of the foregoing: the term "including" should be read as meaning "including, without limitation" or the like; the term "example" is used to provide exemplary instances of the item in discussion, not an exhaustive or limiting list thereof; the terms "a" or "an" should be read as meaning "at least one," "one or more" or the like; and adjectives such as "conventional," "traditional," "normal," "standard," "known" and terms of similar meaning should not be construed as limiting the item described to a given time period or to an item available as of a given time, but instead should be read to encompass conventional, traditional, normal, or standard technologies that may be available or known now or at any time in the future. Likewise, where this document refers to technologies that would be apparent or known to one of ordinary skill in the art, such technologies encompass those apparent or known to the skilled artisan now or at any time in the future.

A group of items linked with the conjunction "and" should not be read as requiring that each and every one of those items be present in the grouping, but rather should be read as "and/or" unless expressly stated otherwise. Similarly, a group of items linked with the conjunction "or" should not be read as requiring mutual exclusivity among that group, but rather should also be read as "and/or" unless expressly stated otherwise. Furthermore, although items, elements or components of the disclosed method and apparatus may be described or claimed in the singular, the plural is contemplated to be within the scope thereof unless limitation to the singular is explicitly stated.

The presence of broadening words and phrases such as "one or more," "at least," "but not limited to" or other like phrases in some instances shall not be read to mean that the narrower case is intended or required in instances where such broadening phrases may be absent. The use of the term "module" does not imply that the components or functionality described or claimed as part of the module are all configured in a common package. Indeed, any or all of the various components of a module, whether control logic or other components, can be combined in a single package or separately maintained and can further be distributed in multiple groupings or packages or across multiple locations.

As will become apparent to one of ordinary skill in the art after reading this document, the disclosed embodiments and their various alternatives can be implemented without confinement to the examples presented.

We claim:

1. A method for determining a number of symbols needed to carry data to be transmitted over at least two bonded channels in a Multimedia over Coax Alliance (MoCA) 2.0 Network by a transmitting node communicating with a Network Controller, the transmitting node comprising at least one integrated circuit, the method comprising:

determining a number of bits per Orthogonal Frequency Division Multiplexing (OFDM) symbol for the at least two channels;

determining a number of parity bits per Low Density Parity Check (LDPC) codeword;

determining a maximum LDPC codeword payload sizes as determined from Error Vector Magnitude (EVM) reports for each channel;

determining a bonded channel frame splitting overhead; and determining a maximum number of payload bits per OFDM symbol for each channel;

wherein the maximum number of payload bits per bonded OFDM symbol in channel i ($M_{BAS,i}$) is determined by the formula:

$$M_{BAS,i} = \left\lfloor N_{BAS,i} \times \frac{kLDPC_{max,i}}{kLDPC_{max,i} + N_{parity}} \right\rfloor$$

where the index i indicates the particular channel, where $N_{BAS,i}$ is the number of bits per OFDM symbol to be used for channel i, where $kLDPC_{max,i}$ is the maximum LDPC codeword payload size for channel i, and $N_{parity}$ is the number of parity bits per LDPC codeword; and transmitting information in the at least two bonded channels to a receiving node.

* * * * *